United States Patent
Han et al.

(10) Patent No.: US 10,276,557 B2
(45) Date of Patent: Apr. 30, 2019

(54) ELECTROSTATIC DISCHARGE PROTECTION DEVICE

(71) Applicant: DONGBU HITEK CO., LTD., Seoul (KR)

(72) Inventors: Jung Woo Han, Incheon (KR); Woo Suk Park, Gyeonggi-do (KR); Jong Min Kim, Seoul (KR)

(73) Assignee: DB Hitek Co., Ltd., Seoul (KR)

( * ) Notice: Subject to any disclaimer, the term of this patent is extended or adjusted under 35 U.S.C. 154(b) by 0 days.

(21) Appl. No.: 15/707,563

(22) Filed: Sep. 18, 2017

(65) Prior Publication Data

US 2018/0082994 A1  Mar. 22, 2018

(30) Foreign Application Priority Data

Sep. 19, 2016  (KR) .................. 10-2016-0119198

(51) Int. Cl.
| | |
|---|---|
| *H01L 27/02* | (2006.01) |
| *H01L 23/60* | (2006.01) |
| *H01L 27/04* | (2006.01) |
| *H01L 29/74* | (2006.01) |
| *H02H 9/04* | (2006.01) |

(52) U.S. Cl.
CPC .......... *H01L 27/0262* (2013.01); *H01L 23/60* (2013.01); *H01L 27/0274* (2013.01); *H01L 27/04* (2013.01); *H01L 29/7408* (2013.01); *H02H 9/046* (2013.01)

(58) Field of Classification Search
CPC . H01L 27/0262; H01L 29/7408; H01L 27/04; H01L 23/60; H01L 27/0274; H02H 9/046
See application file for complete search history.

(56) References Cited

U.S. PATENT DOCUMENTS

| | | |
|---|---|---|
| 2006/0223257 A1 | 10/2006 | Williams et al. |
| 2011/0176244 A1 | 7/2011 | Gendron et al. |
| 2011/0303947 A1 | 12/2011 | Salcedo et al. |
| 2013/0328103 A1* | 12/2013 | Salcedo .............. H01L 27/0262 257/121 |
| 2018/0069111 A1 | 3/2018 | Noh et al. |

* cited by examiner

*Primary Examiner* — Su C Kim
(74) *Attorney, Agent, or Firm* — Patterson Thuente Pedersen, P.A.

(57) ABSTRACT

An ESD protection device includes a semiconductor substrate of p-type conductivity, an epitaxial layer of p-type conductivity, a buried layer of n-type conductivity, device isolation layers, a first well of n-type conductivity, an emitter formed by implanting p-type impurities into an upper portion of the first well, a second well of p-type conductivity, a collector formed by implanting p-type impurities into an upper portion of the second well, a first P-body region interposed between the second well and the collector, a third well of n-type conductivity, a base formed by implanting n-type impurities into an upper surface portion of the third well, and a first deep well of n-type conductivity, interposed between the third well and the buried layer.

9 Claims, 13 Drawing Sheets

ELECTROSTATIC DISCHARGE PROTECTION DEVICE

CROSS-REFERENCE TO RELATED APPLICATION

This application claims priority to Korean Patent Application No. 10-2016-0119198, filed on Sep. 19, 2016 and all the benefits accruing therefrom under 35 U.S.C. § 119, the contents of which are incorporated by reference in their entirety.

TECHNICAL FIELD

The present invention relates to an electrostatic discharge protection device, and more particularly, to an electrostatic discharge protection device for protecting an external device from electrostatic discharge under the condition of a high voltage operation.

BACKGROUND

In general, devices such as silicon controlled rectifiers (SCR), double diffusion metal-oxide-semiconductor (DMOS) transistors, and bipolar junction transistors (BJT) are used as high-voltage electrostatic discharge (ESD) protection devices. A BJT consists of an emitter, base, and collector, and can be divided into a horizontal BJT and a vertical BJT, depending on a direction of charge transfer.

Figure 1:
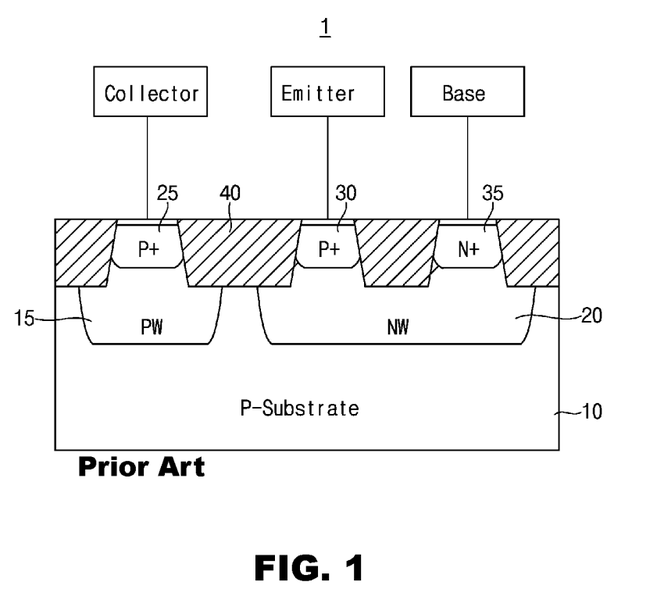
FIG. 1 is a cross sectional view illustrating a conventional ESD protection device including a planar PNP transistor structure.

FIG. 1 is a cross sectional view illustrating a conventional ESD protection device including a planar PNP transistor structure.

Referring to FIG. 1, a conventional ESD protection device includes a p-type semiconductor substrate 10, a first well 15 formed by implanting p-type impurities into an upper left surface portion of the semiconductor substrate 10, and a second well 20 formed by implanting n-type impurities into an upper right surface portion of the semiconductor substrate 10.

A region where the first well 15 is formed corresponds to a collector region, and a region where the second well 20 is formed corresponds to a base region and an emitter region. P-type impurities are implanted into the first well 15 to form a collector 25 of P+ conductivity, whereas p-type impurities are implanted into one side of the second well 20, adjacent to the collector 25 to form an emitter 30 of P+ conductivity. Further, n-type impurities are implanted into the other side of the second well 20 to form a base 35 of N+ conductivity.

Element isolation layers 40 are provided between the collector 25, the emitter 30 and the base 35 to separate the collector 25, the emitter 30 and the base 35 from one another.

The ESD protection device 1 has a structure symmetrical with respect to the base 35. The emitter 30 and the base 35 are connected to a $V_{DD}$ (positive) terminal, and the collector 25 is connected to a ground terminal in order to apply the ESD protection device 1 for protection of an internal device from an electrostatic discharge.

The ESD protection device 1 is used to protect a semiconductor device from electrostatic discharge. When the electrostatic voltage is applied, the ESD protection device 1 quickly pulls out an electrostatic current to the ground terminal. Therefore, in order for the ESD protection device 1 to function as an electrostatic discharge protection device efficiently, both a first trigger voltage at which the ESD protection device 1 starts to operate and a second trigger voltage at which the ESD protection device is destroyed due to leakage current and heat generation must be lower than the breakdown voltage of the internal circuit. In addition, a holding voltage which is the voltage dropped after the ESD protection device 1 is triggered, should be higher than an operation voltage of the internal circuit.

As described above, the ESD protection device 1 based on the PNP transistor has a high holding voltage and thus has a high utilization degree as an electrostatic protection device for a high voltage. However, since a value of on-resistance $R_{on}$ is relatively high due to the nature of the structure, the second trigger voltage may exceed the breakdown voltage of the internal circuit. Thus, it may be required to enlarge the area of the ESD protection device 1 in order to lower the value of the on-resistance $R_{on}$ for normal operation of the ESD protection device 1 in the design area. As a result, there is a disadvantage that the size of the ESD protection element 1 becomes larger.

SUMMARY

Example embodiments of the present invention provide ESD protection devices having relatively a low on resistance ($R_{on}$) and a high second trigger current, respectively.

According to an example embodiment of the present invention, an ESD protection device includes a semiconductor substrate of p-type conductivity, an epitaxial layer of p-type conductivity arranged on an upper surface of the semiconductor substrate, and a buried layer, having a predetermined width, of n-type conductivity interposed along a boundary between the upper surface of the semiconductor layer substrate and a lower surface of the epitaxial layer. The ESD protection device further includes a plurality of device isolation layers arranged within an upper surface portion of the epitaxial layer, having a predetermined depth and dividing the upper portion of the epitaxial layer epitaxial layer into an emitter region, a collector region and a base region. A first well of n-type conductivity is arranged in the emitter region of the epitaxial layer and has a first depth larger than that of the device isolation layers. An emitter is formed by implanting p-type impurities into an upper surface portion of the first well. A second well of p-type conductivity, is arranged in the collector region of the epitaxial layer and has a second depth larger than that of the device isolation layers. A collector is formed by implanting p-type impurities into an upper surface portion of the second well, and a first P-body region is interposed between the second well and the collector. A third well of n-type conductivity is arranged in the base region of the epitaxial layer and has a third depth larger than that of the device isolation layers. A base is formed by implanting n-type impurities into an upper surface portion of the third well, and a first deep well of n-type conductivity is interposed between the third well and the buried layer.

According to an example embodiment of the present invention, the collector region may be arranged between the emitter region and the base region and the collector region and the base region are symmetrically arranged about the emitter region.

According to an example embodiment of the present invention, the base region may comprise a ring shape of surrounding the emitter region and the collector region. In embodiments, the collector region and the base region may be arranged in concentric rings around the emitter region.

According to an example embodiment of the present invention, an ESD protection device may further include a second deep well of n-type conductivity, interposed between the first well and the buried layer.

According to an example embodiment of the present invention, an ESD protection device may further include a second P-body region interposed between the first well and the emitter.

According to an example embodiment of the present invention, an ESD protection device may further include a second deep well of n-type conductivity, interposed between the first well and the buried layer, and a second P-body region interposed between the first well and the emitter.

According to an example embodiment of the present invention, the epitaxial layer further may further comprise a P-sub region, separated from the base region by one or more additional device isolation layers. The ESD protection device may further include a fourth well of p-type conductivity formed in the epitaxial layer of the P-sub region and having a fourth depth larger than that of the device isolation layers and a P-sub formed by implanting p-type impurities into an surface upper portion of the fourth well.

In an example embodiment of the present invention, some of the device isolation layers formed between the emitter region and the collector region may be replaced with ion implantation blocking layers formed on the upper surface portion of the epitaxial layer. According to an example embodiment of the present invention, an ESD protection device includes a semiconductor substrate of p-type conductivity, an epitaxial layer of p-type conductivity arranged on an upper surface of the semiconductor substrate, and a buried layer, having a predetermined width, of n-type conductivity interposed along a boundary between the upper surface of the semiconductor layer substrate and a lower surface of the epitaxial layer. The ESD protection device further includes a plurality of device isolation layers arranged within an upper surface portion of the epitaxial layer, having a predetermined depth and dividing the upper portion of the epitaxial into an emitter-collector region, and a base region. At least two ion implantation layers may be arranged on an upper surface of the epitaxial layer and divide the emitter-collector region into an emitter region and a collector region. A first well of n-type conductivity is arranged in the emitter region of the epitaxial layer and has a first depth larger than that of the device isolation layers. An emitter is formed by implanting p-type impurities into an upper surface portion of the first well. A second well of p-type conductivity, is arranged in the collector region of the epitaxial layer and has a second depth larger than that of the device isolation layers. A collector is formed by implanting p-type impurities into an upper surface portion of the second well, and a first P-body region is interposed between the second well and the collector. A third well of n-type conductivity is arranged in the base region of the epitaxial layer and has a third depth larger than that of the device isolation layers. A base is formed by implanting n-type impurities into an upper surface portion of the third well, and a first deep well of n-type conductivity is interposed between the third well and the buried layer.

In an example embodiment of the present invention, the first well may be replaced with a drift ion region of n-type conductivity.

According to example embodiments, ESD protection devices including a first P-body region between the second well and the collector in the collector region may have an increased an impurity concentration in the collector region. Therefore, the second trigger current can be increased by the increased junction area of the collector, and the resistance of the current path can be lower than in embodiments where the first p-body region is not provided, which may result in thereby lowering the on resistance ($R_{on}$).

ESD protection devices including a ring shaped base region surrounding the emitter region and the collector region, can have an increased area of the base. As the area of the base increases, the holding voltage of the ESD protection device can be increased.

In addition, the ring shaped base region may serve to isolate the ESD protection device from an external device. Therefore, since an isolation structure for isolating internal circuits from the external device is unnecessary, the size of the ESD protection device can be reduced. The second deep well may serve to increase the width of the base region such that a path resistance of a base current can be lowered.

The second P-body region between the first well and the emitter, can increase an impurity concentration of the emitter region and the junction area of the emitter. Therefore, the second trigger current can be increased in ESD protection device, and the resistance of the current path can be lowered to lower the value of on resistance ($R_{on}$) than is the case where the second P-body region is not present.

In ESD protection devices having an ion implantation blocking layer provided on the surface portion of the epitaxial layer between the emitter region and the collector, the junction area of the emitter can be increased by a depth of the isolation film, so that the second trigger current can be further increased in the ESD protection device.

In the ESD protection device where the first well is a drift ion region of n-type conductivity the resistance of the current path may be further lowered.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a layer, a region or a plate is referred to as being 'on' another one, it can be directly on the other one, or one or more intervening layers, layers, regions or plates may also be present. Unlike this, it will also be understood that when a layer, a layer, a region or a plate is referred to as being 'directly on' another one, it is directly adjacent to the other one, and one or more intervening layers, layers, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for the purpose of explaining specific embodiments and are not intended to limit the scope of the present invention. Unless otherwise defined herein, all the terms used herein, which include technical or scientific terms, have the same meaning that is generally understood by those skilled in the art.

The depicted embodiments are described with reference to schematic diagrams of some embodiments of the present invention. Accordingly, changes in the shapes of the diagrams, for example, due to changes in manufacturing techniques and/or allowable errors, are sufficiently expected. Accordingly, embodiments of the present invention are not described as being limited to specific shapes or areas depicted in the diagrams and include deviations in the shapes and also the areas described with drawings are entirely schematic and their shapes do not represent accurate shapes and also do not limit the scope of the present invention.

Figure 2:
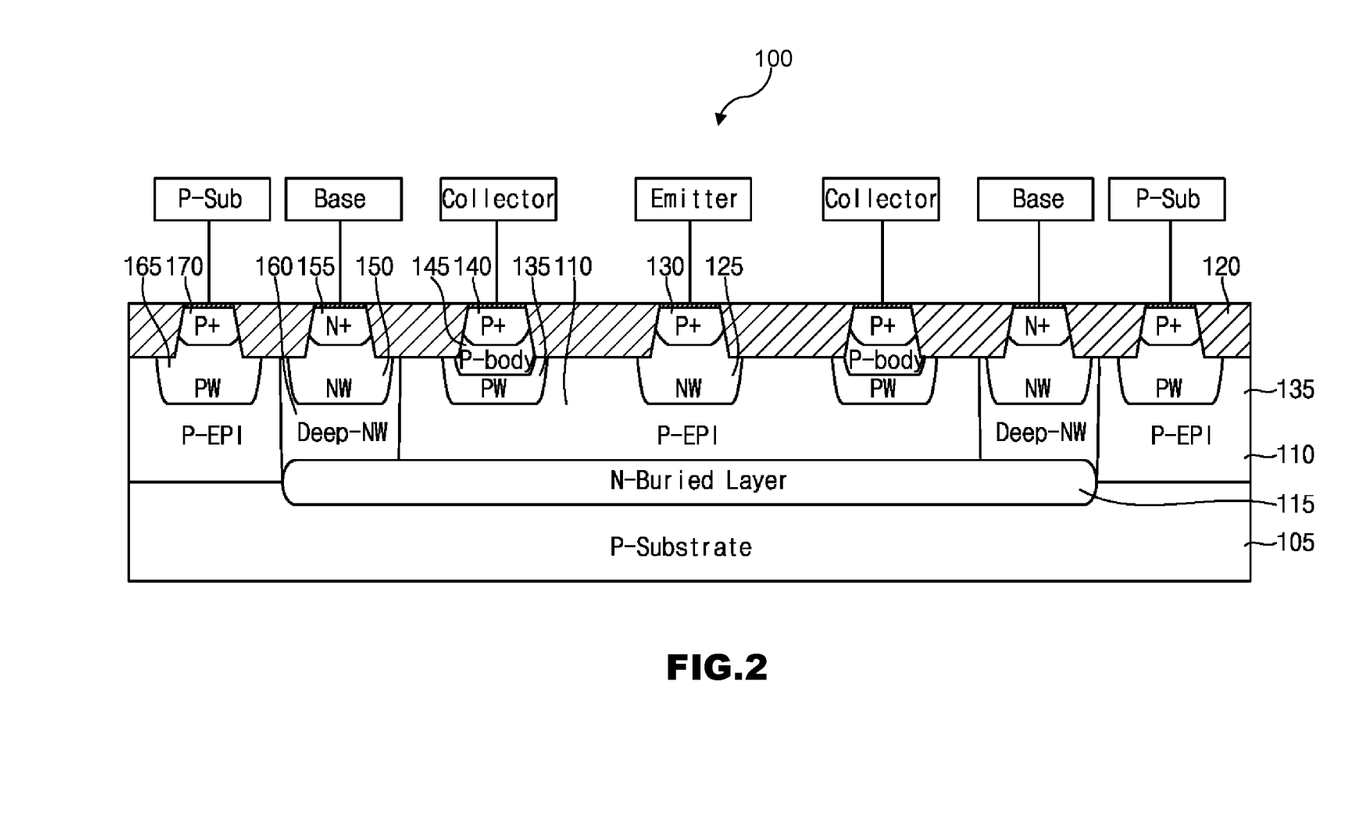
FIGS. 2-13 are cross sectional views illustrating various embodiments of ESD protection devices in accordance with embodiments of the present disclosure.

FIG. 2 is a cross sectional view illustrating an ESD protection device in accordance with an example embodiment of the present invention.

Referring to FIG. 2, according to an example embodiment of the present invention, an ESD protection device 100 includes a semiconductor substrate 105, an epitaxial layer 110, a buried layer 115, device isolation layers 120, a first well 125, an emitter 130, a second well 135, a collector 140, a first P-body region 145, a third well 150, a base 155, a first deep well 160, a fourth well 165 and a P-sub 170.

The semiconductor substrate 105 may include a p-type semiconductor substrate.

The epitaxial layer 110 may have p-type conductivity. The epitaxial layer 110 is formed on the semiconductor substrate 105. The epitaxial layer 110 may be formed by an epitaxial growth process, or other appropriate method.

The buried layer 115 may have n-type conductivity. The buried layer 115 may be formed along an interface between an epitaxial layer 110 and a semiconductor substrate 105. The buried layer 115 may have a predetermined width.

The device isolation layers 120 are formed at an upper portion of the epitaxial layer 110 to define an emitter region, a collector region, a base region and a P-Sub region. Each of the device isolation layers 120 has a predetermined depth measured from an upper face of the epitaxial layer 110. The emitter region, the collector region and the base region are positioned over the buried layer 115.

In particular, the device isolation layers 120 may be divided into a sequence of the emitter region, the collector region and the base region and the P-sub region Each of the device isolation layers 120 may have a shallow trench isolation (STI) structure or have a local oxidation of silicon (LOCOS) structure. The device isolation layers 120 may be formed using oxide.

The first well 125 is provided at a first depth in the emitter region of the epitaxial layer 110. The first well 125 may have the first depth larger than that of the device isolation layers 115. The first well 125 may have n-type conductivity and may be formed by implanting n-type impurities into the emitter region of the epitaxial layer 110.

The emitter 130 is formed by implanting high concentration p-type impurities into a surface portion of the first well 125. The emitter 130 may be electrically connected to an emitter terminal (not shown).

The second well 135 is provided at a second depth in the collector region of the epitaxial layer 110. The second well 135 may have the second depth larger than that of the device isolation layers 115. The second well 135 may have p-type conductivity and may be formed by implanting p-type impurity into the collector region of the epitaxial layer 110.

The collector 140 may be formed by implanting high concentration p-type impurities into a surface portion of the second well 135. The collector 140 may be electrically connected to a collector terminal (not shown).

The first P-body region 145 may be formed between the second well 135 and the collector 140. The first P-body region 145 may be formed by implanting high concentration p-type impurities into the second well 135. The first P-body region 145 may increase the concentration of p-type impurities of the collector region. This may increase the junction area of the collector 140 resulting in a heightened second trigger current. Further, in comparison to an ESD protection device without a first P-body region 145, the resistance for the current pathway may decrease resulting in a lower on-resistance $R_{on}$ of the ESD protection device.

In embodiments, the elements of the collector region (i.e., the second well 135, the collector 140, and the first P-body region 145) can be arranged in stripes along both sides of the emitter region.

In alternative embodiments, the collector region may be arranged in a ring shape of surrounding the emitter region. That is, each of the second well 135, the collector 140, and the first P-body region 145 may be provided in a ring shape.

The third well 150 may be provided at a third depth in the base region of the epitaxial layer 110. The third depth may be larger than that of the device isolation layers 115. The third well 150 may have an n-type conductivity created by implanting n-type impurities into the base region of the epitaxial layer 110.

The base 155 may be formed by implanting high concentration n-type impurities into a surface portion of the third well 150. The base 155 may be electrically connected to a base terminal.

The first deep well 160 may have n-type conductivity. The first deep well 160 may be formed in the epitaxial layer 110 and between the third well 130 and the buried well 115. The first deep well 160 may surround a lower face of the third well 150. The first deep well 160 may make contact with a portion of the device isolation layers 120 that is positioned between the collector region and the base region, and a portion of the device isolation layers 120 that is positioned between the base region and the p-sub region.

The first deep well 160 may make contact with the buried layer 115 such that the base region is connected with the n-type buried layer 115. This connection to the larger area buried layer 115 results in a larger base area. The base region may have a ring shape, surrounding the emitter region and the collector region. That is, each of the third well 150, the base 155 and the first deep well 160 may be ring shaped. The ring shape may enlarge the area of the base 155, resulting in a higher maintenance voltage for ESD protection device 100.

In particular, since the first deep well 160 surrounds the emitter region and the collector region, the first deep well 160 may function to prevent a leakage current from occurring in either the emitter region or the collector region.

As illustrated above, the base region may have a ring shape which can isolate the ESD protection device 100 from an external device. Therefore, it may be not necessary to form an additional isolation structure to isolate the ESD protection device 100 from the external device.

The fourth well 165 may be provided at a fourth depth in the p-sub region of the epitaxial layer 110. The fourth well 165 may have a fourth depth that is larger than that of the device isolation layers 115. The fourth well 165 may have p-type conductivity created by implanting p-type impurities into the p-sub region of the epitaxial layer 120.

The p-sub 170 may be formed by implanting high concentration p-type impurities into a surface portion of the fourth well 165. The p-sub 170 may be electrically connected to a p-sub terminal.

Figure 3:
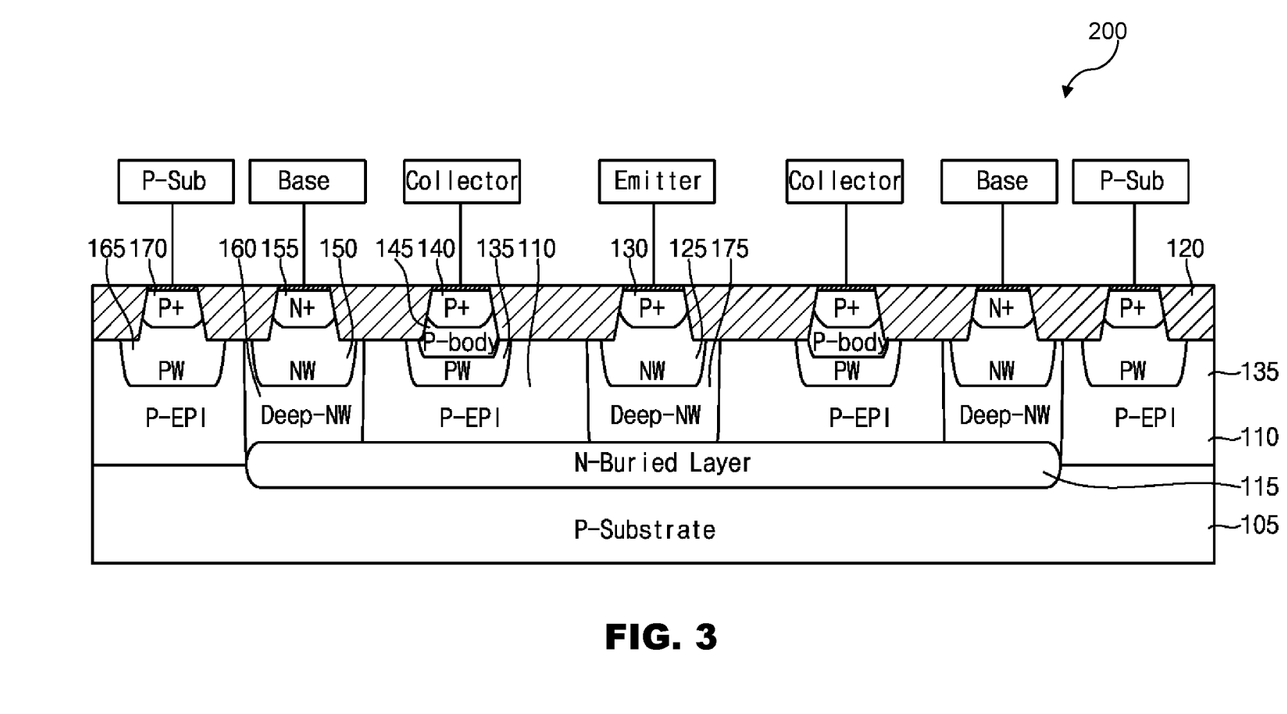
Figure 13:
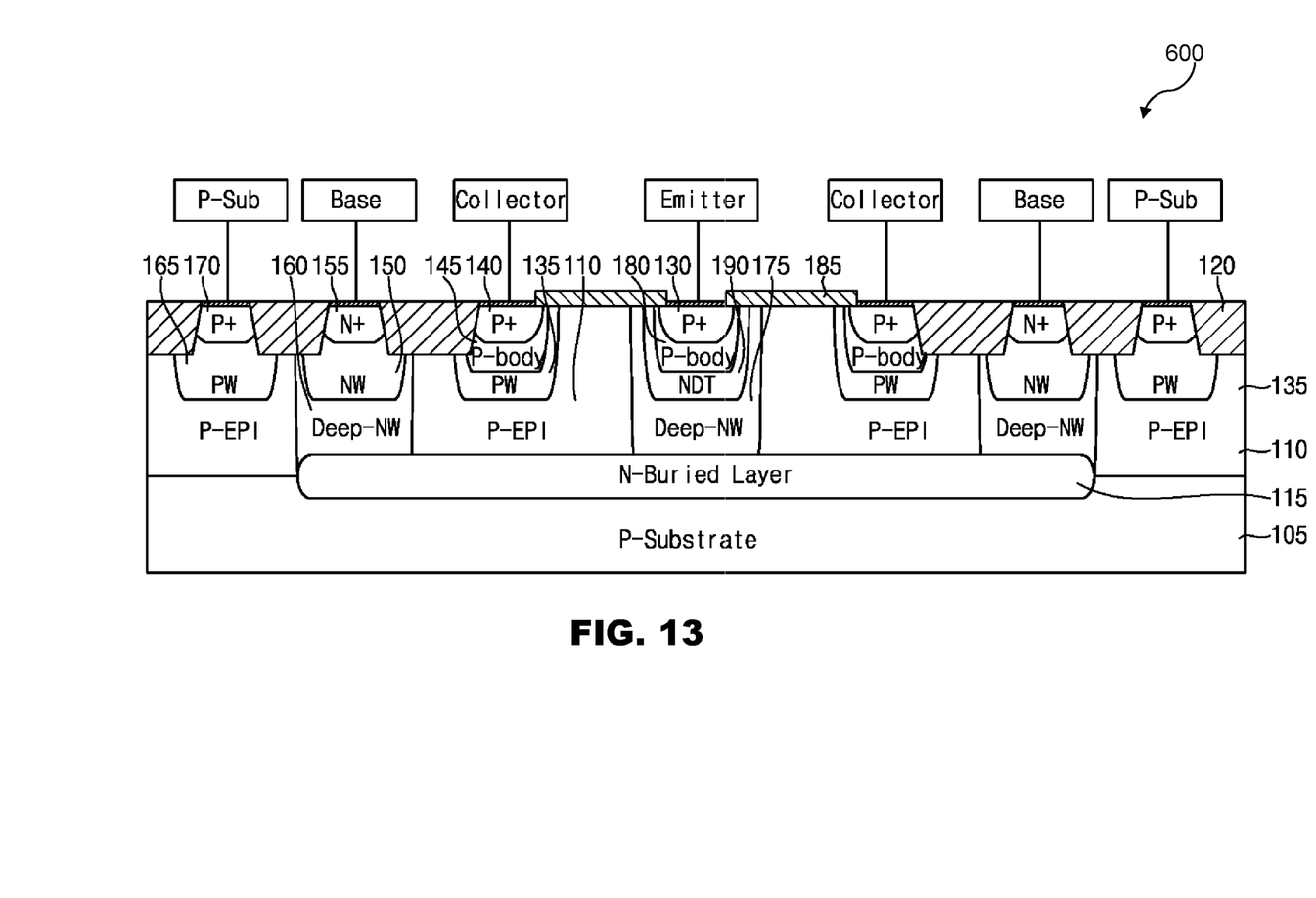

FIGS. 3 and 13 are cross sectional views illustrating various ESD protection devices in accordance with example embodiments of the present invention.

Referring to FIG. 3, according to an example embodiment of the present invention, an ESD protection device 200 includes (like ESD protection device 100) a semiconductor substrate 105, an epitaxial layer 110, a buried layer 115, device isolation layers 120, a first well 125, an emitter 130, a second well 135, a collector 140, a first P-body region 145, a third well 150, a base 155, a first deep well 160, a fourth well 165 and a P-sub 170. ESD protection device 200 further includes a second deep well of n-type conductivity.

The second deep well 175 has N-type conductivity and may be provided between the first well 125 and the buried layer 115 in the epitaxial layer 110. The second deep well 175 may surround a lower surface of the first well 125. Further, the second deep well 175 may make contact with a portion of the device isolation layers 120, which is positioned between the emitter region and the collector region. The second deep well 175 serves to increase a width of a base region, thereby reducing a path resistance of a base current.

Figure 4:
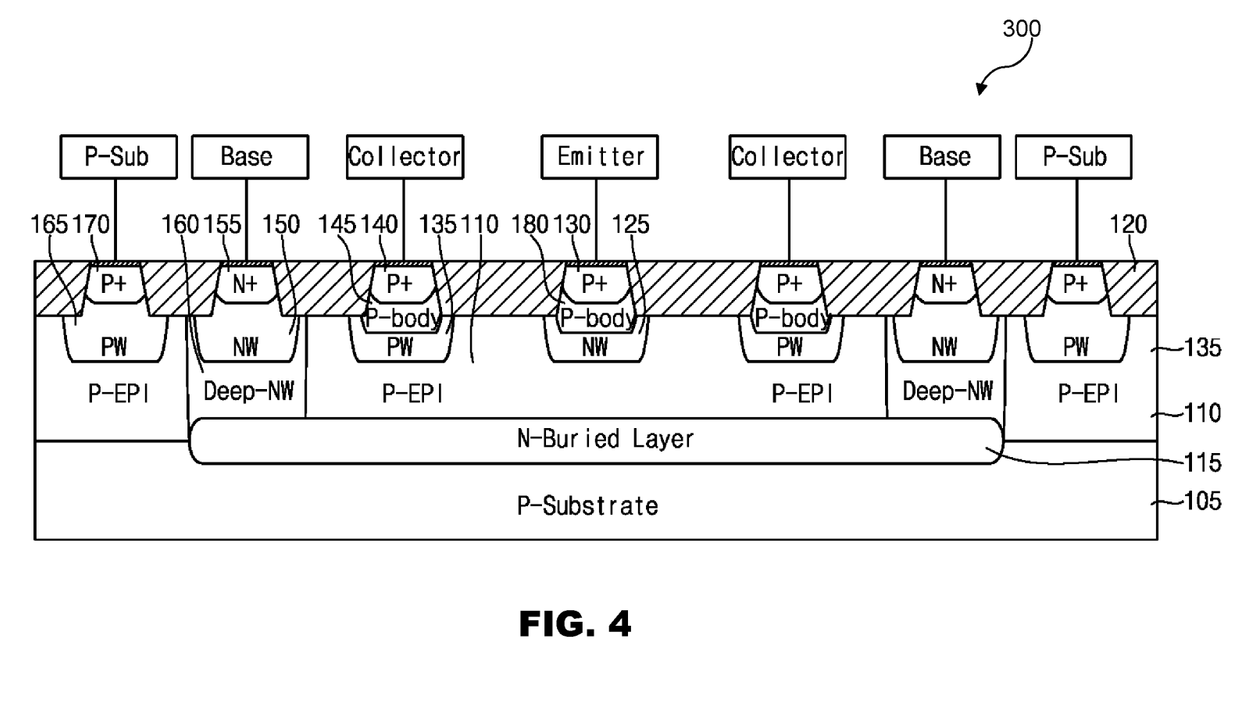

Referring to FIG. 4, according to an example embodiment of the present invention, an ESD protection device 300 includes (like ESD protection device 100) a semiconductor substrate 105, an epitaxial layer 110, a buried layer 115, device isolation layers 120, a first well 125, an emitter 130, a second well 135, a collector 140, a first P-body region 145, a third well 150, a base 155, a first deep well 160, a fourth well 165 and a P-sub 170. ESD protection device 300 further includes a second P-body region 180.

The second P-body region 180 may formed between the first well 125 and the emitter 130 by implanting high concentration p-type impurities into the first well 125. The second P-body region 180 may be provided to increase a junction area of the emitter 130. This may further increase a second trigger current in the ESD protection element 300. In other words, the current at which the ESD protection device 300 is rendered inoperable due to a leakage current, heat generation, or the like, may be increased.

Figure 5:
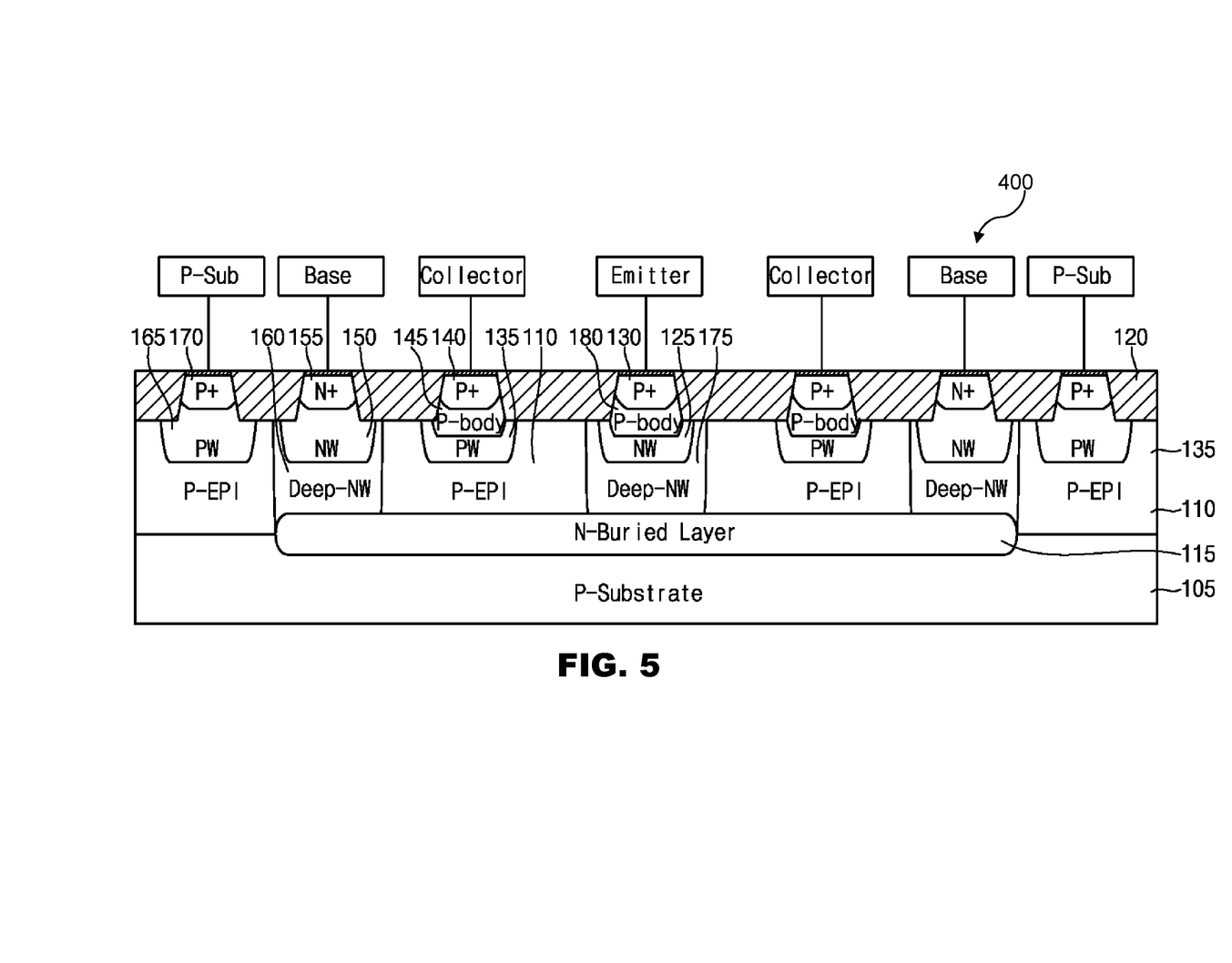

Referring to FIG. 5, according to an example embodiment of the present invention, an ESD protection device 400 includes (like ESD protection device 100) a semiconductor substrate 105, an epitaxial layer 110, a buried layer 115, device isolation layers 120, a first well 125, an emitter 130, a second well 135, a collector 140, a first P-body region 145, a third well 150, a base 155, a first deep well 160, a fourth well 165 and a P-sub 170. ESD protection device 400 further includes a second deep well 175 of n-type conductivity and a second P-body region.

The second deep well 175 may have N-type conductivity may be provided between the first well 125 and the buried layer 115 in the epitaxial layer 110. The second deep well 175 serves to increase a width of a base region, thereby reducing a path resistance of a base current. The second P-body region 180 may be formed between the first well 125 and the emitter 130 by implanting high concentration p-type impurities into the first well 125. The second P-body region 180 may be provided to increase a concentration of p-type impurities of the emitter 130 to increase a junction area of the emitter 130. This can increase the second trigger current of the ESD protection element 400. Further, compare to ESD protection devices without the second P-body region, a resistance of the current path is lower, resulting in a reduced on-resistance $R_{on}$ of the ESD protection device 400.

An ESD protection device 500 is depicted in FIGS. 6 to 9, respectively, and further includes an ion implantation blocking layer 185.

Figure 6:
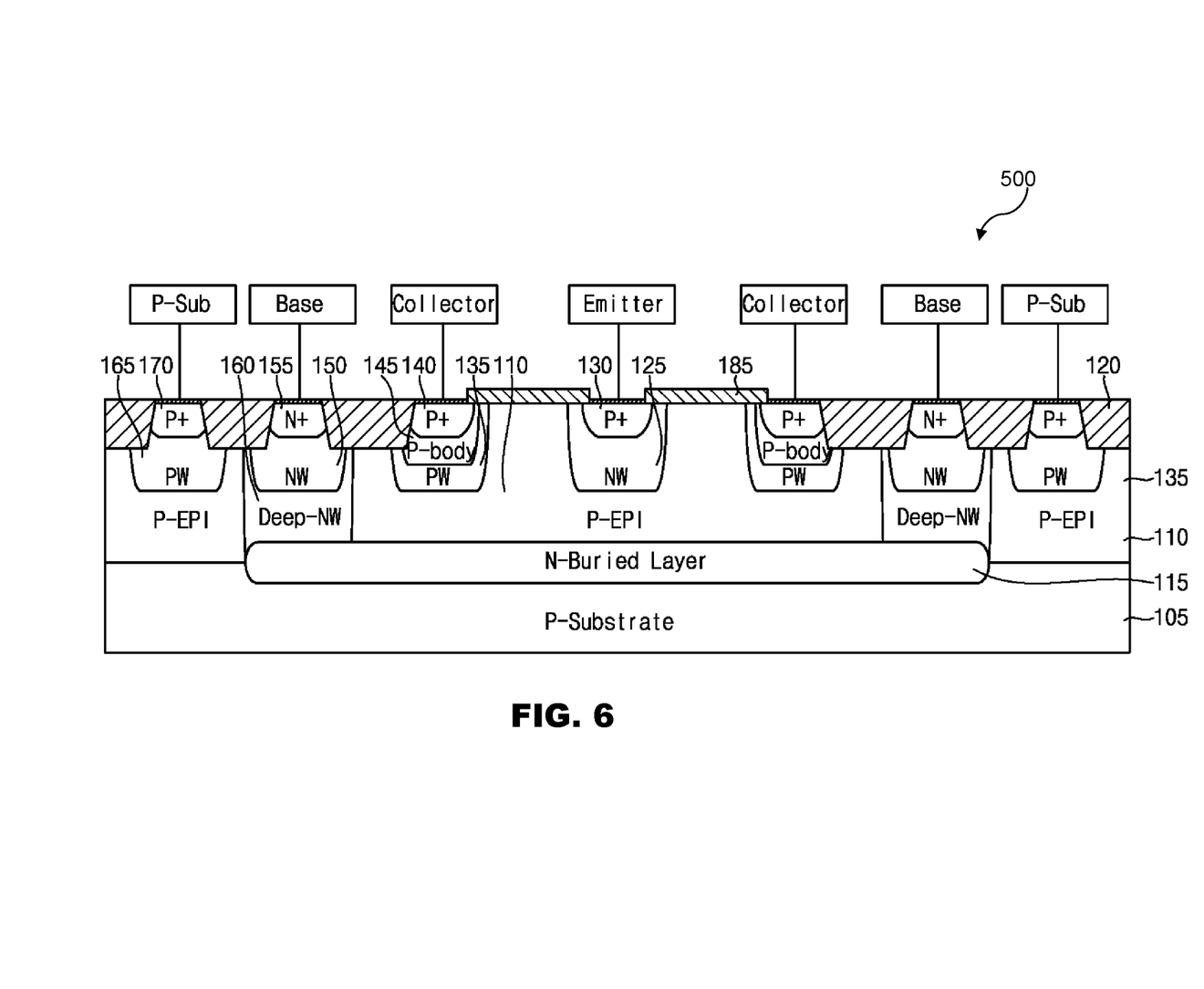

As depicted in FIG. 6, the portions of device isolation layers 120 between the emitter region and the collector region may be replaced by the ion implantation blocking layer 185. The ion implantation blocking layer may be formed on a surface of the epitaxial layer 110

The junction area of the emitter 130 is therefore not limited by the areas of the associated device isolation layers 120. This can result in further increasing the second trigger current of the ESD protection device 500.

Figure 7:
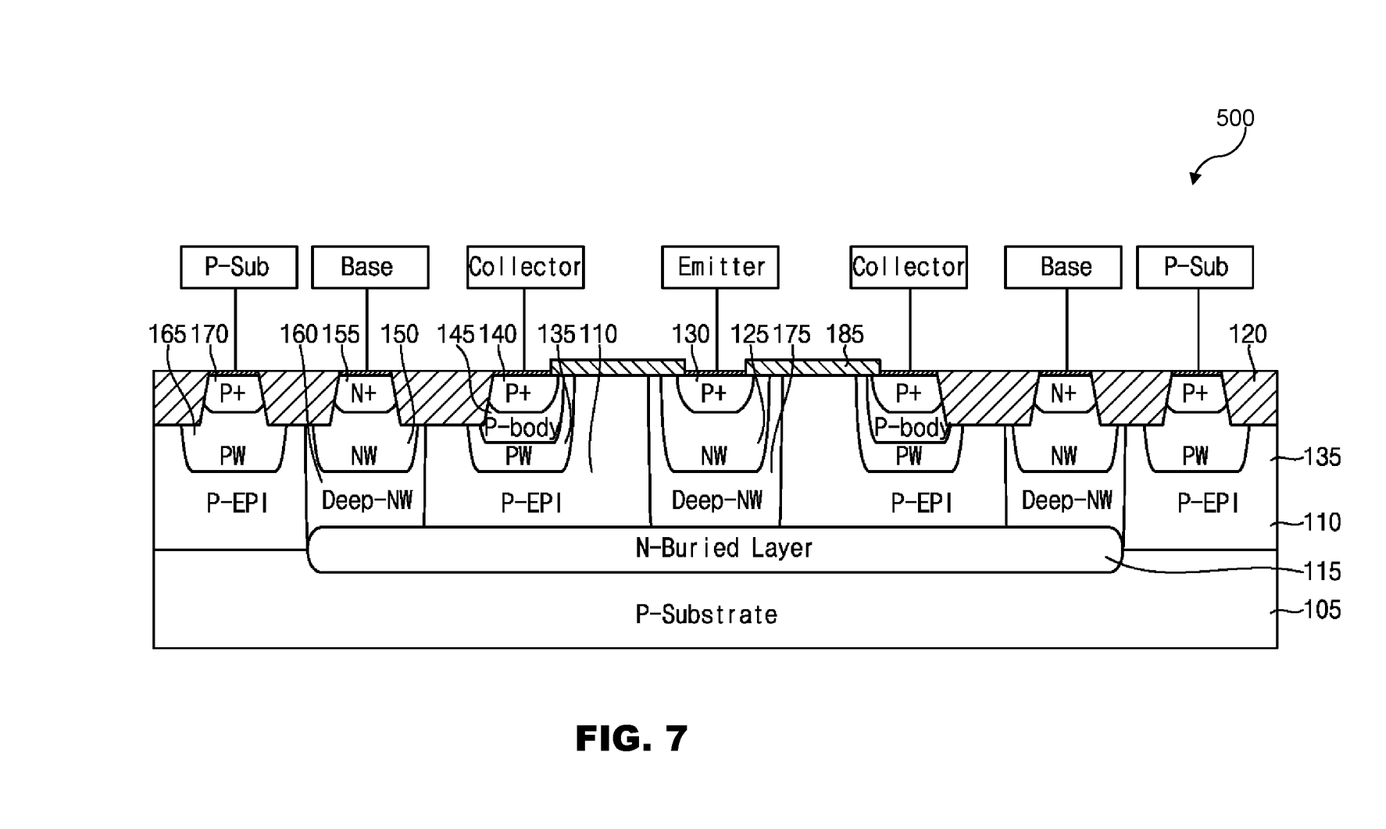
Figure 8:
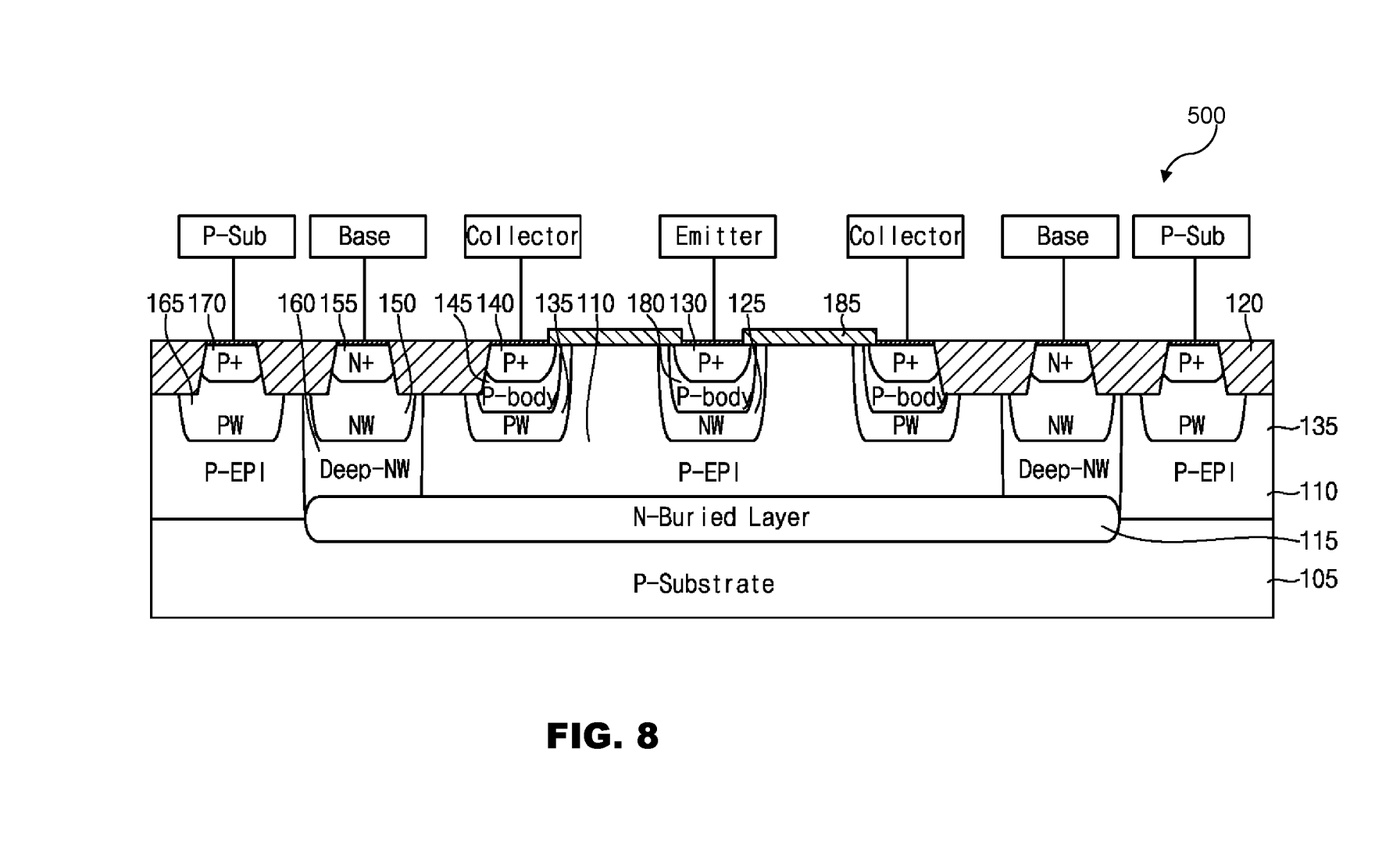
Figure 9:
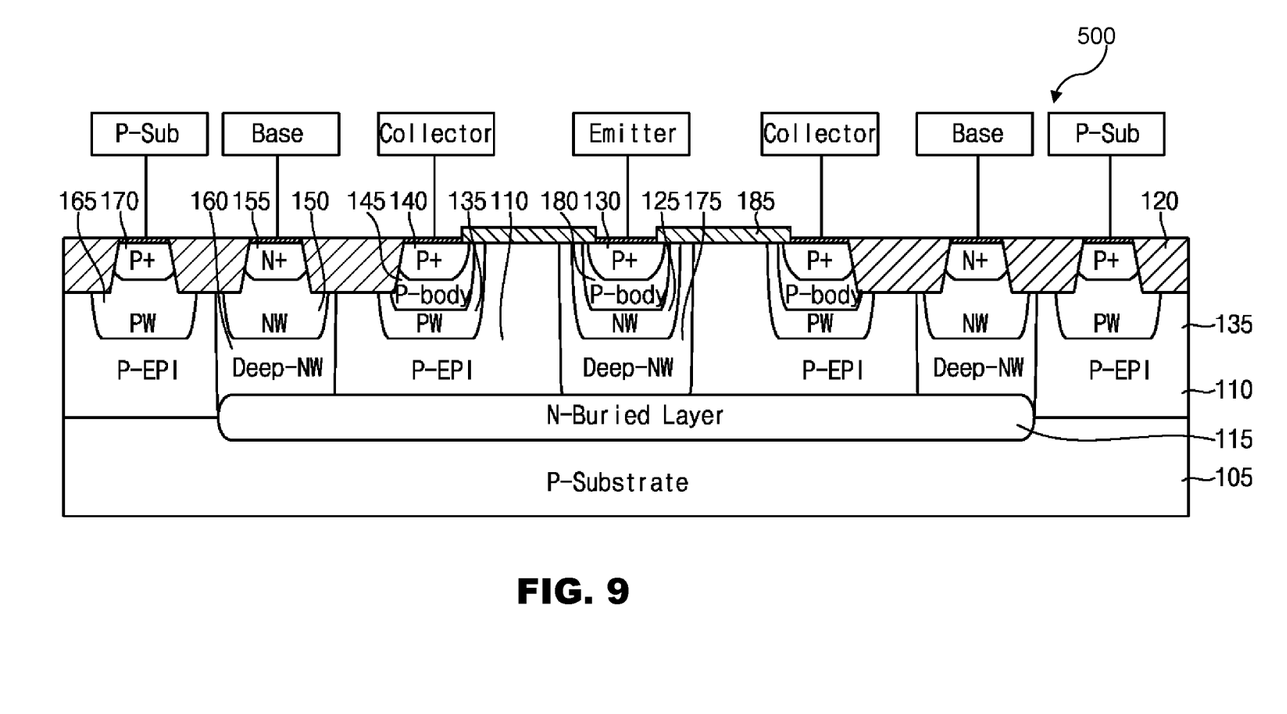

FIGS. 7-9 depict various embodiments of ESD protection device 500 including a second deep well 175, and/or a second p-body 180, as discussed in references to FIGS. 2-5 above.

An ESD protection device 600 is depicted in FIGS. 10 to 13. ESD protection device 600 further includes an ion implantation blocking layer 185 and a drift ion region 190 (NDT) of n-type conductivity.

Figure 10:
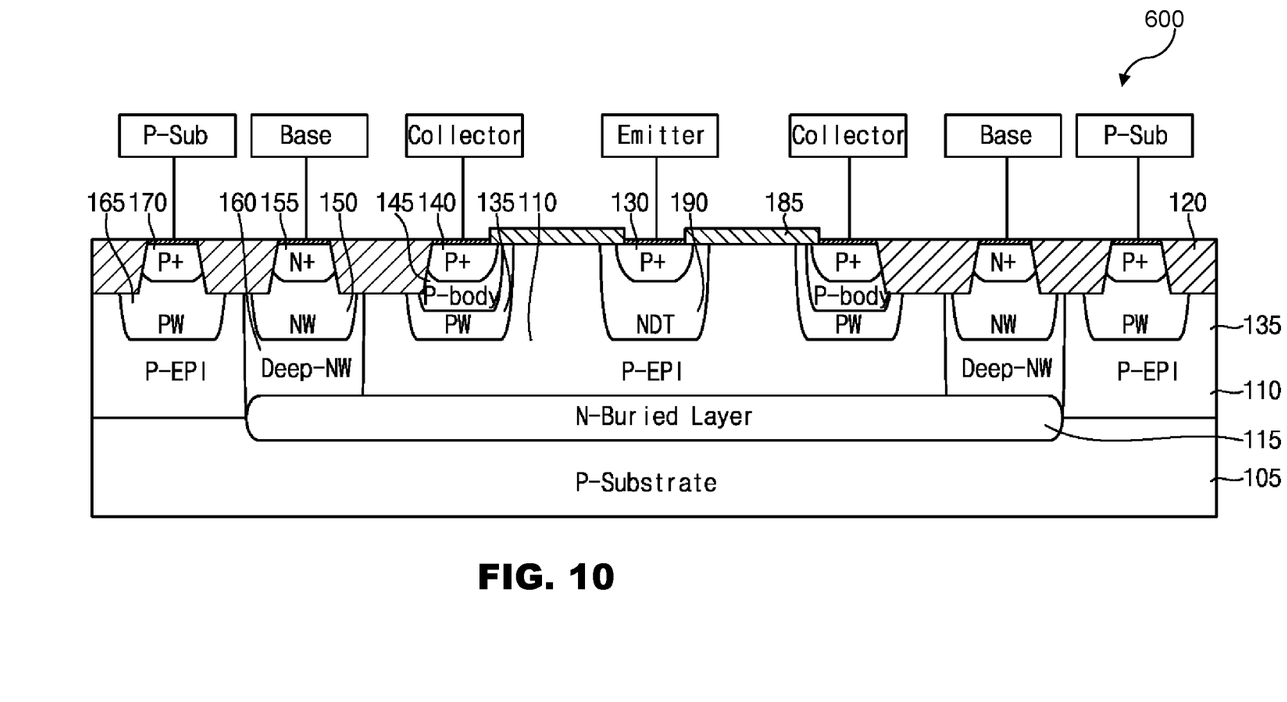

As depicted in FIG. 10, the portions of device isolation layers 120 between the emitter region and the collector region may be replaced by the ion implantation blocking layer 185 which may be formed on a surface of the epitaxial layer 110 between the emitter region and the collector region.

The junction area of the emitter 130 is therefore not limited by the areas of the associated device isolation layers 120. This can result in further increasing the second trigger current of the ESD protection device 600.

In addition, the drift ion region 190 may be provided instead of the first well 125 of ESD protection element 100. The drift ion region 190 can be used to lower the resistance of the current path.

Figure 11:
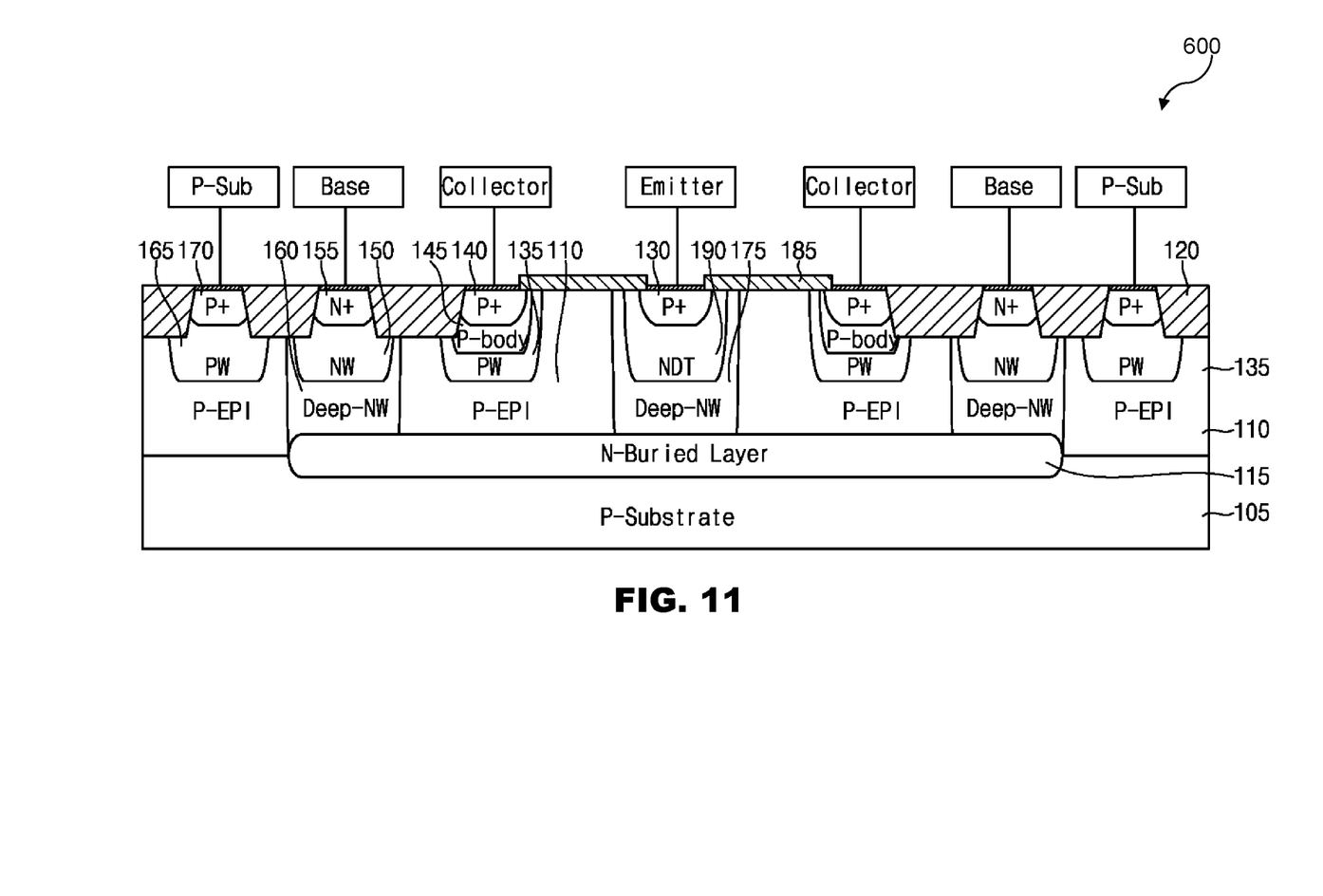
Figure 12:
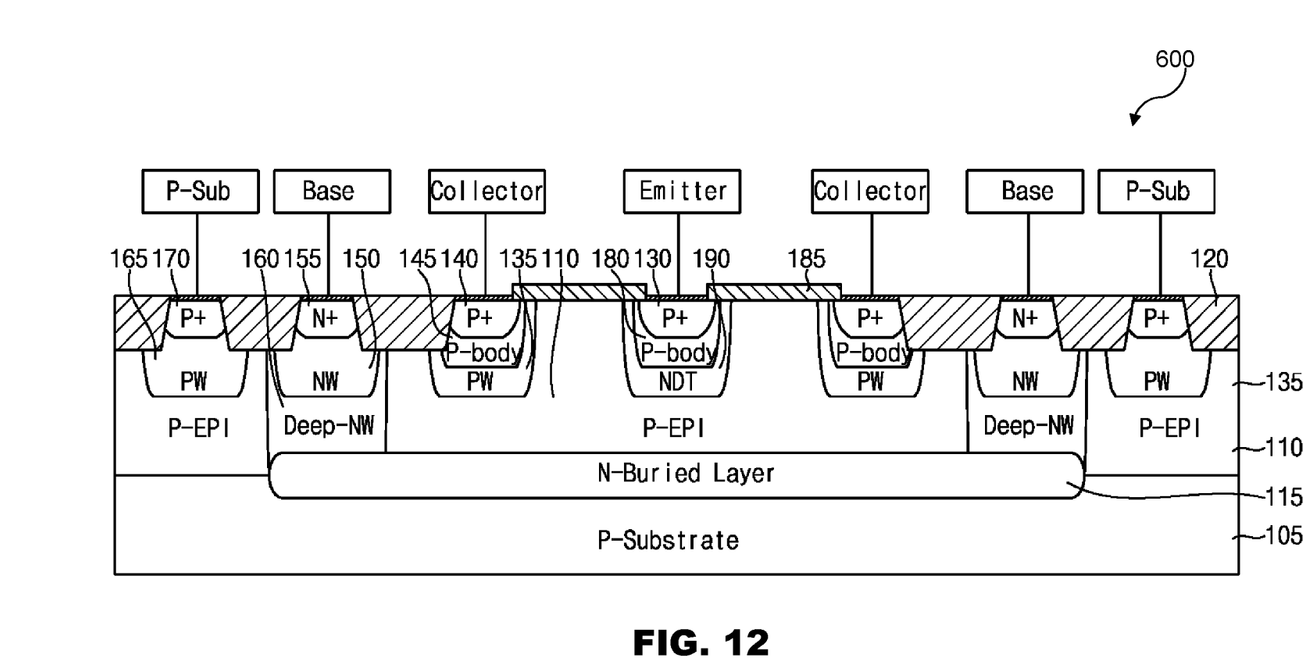

FIGS. 11-13 depict various embodiments of ESD protection device 600 including a second deep well 175, and/or a second p-body 180, as discussed in references to FIGS. 2-5 above.

The various embodiments of ESD protection devices depicted and described herein have low values of on-resistance $R_{on}$ and high second trigger currents, enabling their use as stable a high-voltage ESD protection devices.

In addition, since the ESD protection device depicted and described herein do not require an isolation structure for being isolated from external devices. This enables the size of the ESD protection devices to be reduced.

Although the ESD protection devices have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. An electrostatic discharge (ESD) protection device comprising:
   a semiconductor substrate of p-type conductivity;
   an epitaxial layer of p-type conductivity, arranged over the semiconductor substrate;
   a buried layer of n-type conductivity, interposed along a boundary between an upper surface of the semiconductor substrate and a lower surface of the epitaxial layer, the buried layer having a predetermined width;
   a plurality of device isolation layers arranged within an upper portion of the epitaxial layer, having a predetermined depth and dividing the upper portion of the epitaxial layer into an emitter region, a collector region and a base region;
   a first well of n-type conductivity, arranged in the emitter region of the epitaxial layer and having a first depth larger than that of the device isolation layers;
   an emitter formed by implanting p-type impurities into an upper portion of the first well;
   a second well of p-type conductivity, arranged in the collector region of the epitaxial layer and having a second depth larger than that of the device isolation layers;
   a collector formed by implanting p-type impurities into an upper portion of the second well;
   a first P-body region interposed between the second well and the collector;
   a third well of n-type conductivity, formed in the base region of the epitaxial layer and having a third depth larger than that of the device isolation layers;
   a base formed by implanting n-type impurities into an upper portion of the third well; and
   a first deep well of n-type conductivity, interposed between the third well and the buried layer.

2. The ESD protection device of claim 1, wherein the collector region is arranged between the emitter region and the base region; and the collector region and the base region are symmetrically arranged about the emitter region.

3. The ESD protection device of claim 1, wherein the base region comprises a ring shape to surround the emitter region and the collector region.

4. The ESD protection device of claim 1, further comprising a second deep well of n-type conductivity, interposed between the first well and the buried layer.

5. The ESD protection device of claim 1, further comprising a second P-body region interposed between the first well and the emitter.

6. The ESD protection device of claim 1, further comprising:
   a second deep well of n-type conductivity, interposed between the first well and the buried layer; and
   a second P-body region interposed between the first well and the emitter.

7. The ESD protection device of claim 1, wherein the epitaxial layer further comprises a P-sub region, separated from the base region by one or more additional device isolation layers; and wherein the ESD protection device further comprises:
   a fourth well of p-type conductivity, formed in the epitaxial layer of the P-sub region and having a fourth depth larger than that of the device isolation layers; and
   a P-sub formed by implanting p-type impurities into an upper portion of the fourth well.

8. An electrostatic discharge (ESD) protection device comprising:
   a semiconductor substrate of p-type conductivity;
   an epitaxial layer of p-type conductivity, arranged over the semiconductor substrate;
   a buried layer of n-type conductivity, interposed along a boundary between an upper surface of the semiconductor substrate and a lower surface of the epitaxial layer, the buried layer having a predetermined width;

a plurality of device isolation layers arranged within an upper portion of the epitaxial layer, having a predetermined depth and dividing the upper portion of the epitaxial layer into an emitter-collector region, and a base region;

at least two ion implantation blocking layers arranged on an upper surface of the epitaxial layer and dividing the emitter-collector region into an emitter region and a collector region;

a first well of n-type conductivity, arranged in the emitter region of the epitaxial layer and having a first depth larger than that of the device isolation layers;

an emitter formed by implanting p-type impurities into an upper portion of the first well;

a second well of p-type conductivity, formed in the collector region of the epitaxial layer and having a second depth larger than that of the device isolation layers;

a collector formed by implanting p-type impurities into an upper portion of the second well;

a first P-body region interposed between the second well and the collector;

a third well of n-type conductivity, formed in the base region of the epitaxial layer and having a third depth larger than that of the device isolation layers;

a base formed by implanting n-type impurities into an upper portion of the third well; and a first deep well of n-type conductivity, interposed between the third well and the buried layer.

9. The ESD protection device of claim 8, wherein the first well comprises a drift ion region of n-type conductivity.

* * * * *